(12) United States Patent
Weder

(10) Patent No.: US 6,298,637 B1
(45) Date of Patent: *Oct. 9, 2001

(54) PACKAGING MATERIAL

(75) Inventor: Donald E. Weder, Highland, IL (US)

(73) Assignee: Southpac Trust International, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/717,540

(22) Filed: Nov. 21, 2000

Related U.S. Application Data

(60) Continuation of application No. 09/522,429, filed on Mar. 9, 2000, now Pat. No. 6,202,390, which is a division of application No. 09/293,561, filed on Apr. 15, 1999, now abandoned, which is a continuation of application No. 08/934,104, filed on Sep. 19, 1997, now abandoned.

(51) Int. Cl.$^7$ ..................................................... B65B 11/58
(52) U.S. Cl. .................................. 53/449; 53/472; 53/473
(58) Field of Search ........................... 53/472, 474, 449, 53/473, 175; 156/72, 297; 206/521, 584, 594, 814; 493/907, 967; 428/17, 85, 95, 96, 105, 107, 108, 109, 110, 111, 152, 153, 304.4, 36.1, 36.3, 36.4, 90

(56) References Cited

U.S. PATENT DOCUMENTS

| | | | |
|---|---|---|---|
| 1,939,846 | 12/1933 | Fenton | 154/2 |
| 3,314,122 | 4/1967 | Bundy | 28/1 |
| 3,485,428 | 12/1969 | Jackson | 226/97 |
| 3,509,797 | * 5/1970 | Johnson | 53/472 |
| 3,519,528 | 7/1970 | Fourness | 428/153 |
| 3,667,593 | * 6/1972 | Pendleton | 53/474 |
| 3,696,183 | 10/1972 | Steel et al. | 264/164 |
| 3,752,121 | 8/1973 | Brazzell | 119/1 |
| 4,153,488 | 5/1979 | Wiegand | 156/62.2 |
| 4,199,627 | 4/1980 | Weder et al. | 428/7 |
| 4,292,266 | 9/1981 | Weder et al. | 264/140 |
| 4,350,726 | 9/1982 | Berry, Jr. | 428/95 |
| 4,401,700 | 8/1983 | Weder et al. | 428/17 |
| 4,549,908 | 10/1985 | Weder et al. | 106/266 |
| 4,568,581 | 2/1986 | Peoples, Jr. | 428/35 |
| 4,761,318 | 8/1988 | Ott et al. | 428/85 |
| 5,134,013 | 7/1992 | Parker | 428/182 |
| 5,154,961 | 10/1992 | Reuben | 428/95 |
| 5,178,922 | 1/1993 | Ferrier et al. | 428/95 |
| 5,204,155 | 4/1993 | Bell et al. | 428/95 |
| 5,346,757 | 9/1994 | Nakata | 428/95 |
| 5,397,413 | 3/1995 | Trimble et al. | 156/167 |
| 5,411,167 | 5/1995 | Weder | 220/460 |
| 5,786,060 | 7/1998 | Takahashi et al. | 428/95 |
| 5,906,280 | * 5/1999 | Weder | 206/584 |
| 5,910,089 | * 6/1999 | Weder | 53/472 |

OTHER PUBLICATIONS

Exhibit A—"Beauty Grass®" brochure, not dated, published by Applicant, showing shredded grasses for sale.
Exhibit B—"Highlander® Easter Season Headquarters" brochure, not dated, published by Applicant, showing shredded grasses for sale.
Exhibit C—"Make Highlander® Your Headquarters for Easter and Other Holidays" brochure, published in 1991 by Applicant, showing shredded grasses for sale.
Exhibit D—Undated brochure, published by Applicant, showing shredded grasses for sale.

* cited by examiner

*Primary Examiner*—John Sipos
(74) *Attorney, Agent, or Firm*—Dunlap, Codding & Rogers, P.C.

(57) ABSTRACT

A packaging material for use in filling baskets and protecting articles during a shipping process. The packaging material includes a flexible backing having a first surface and a second surface. A mass of individual, thin, flexible strips of material intertwined with one another to form a cohesive, resilient tuft, the mass is connected to a flexible backing so as to substantially cover at least one side of the flexible backing.

8 Claims, 3 Drawing Sheets

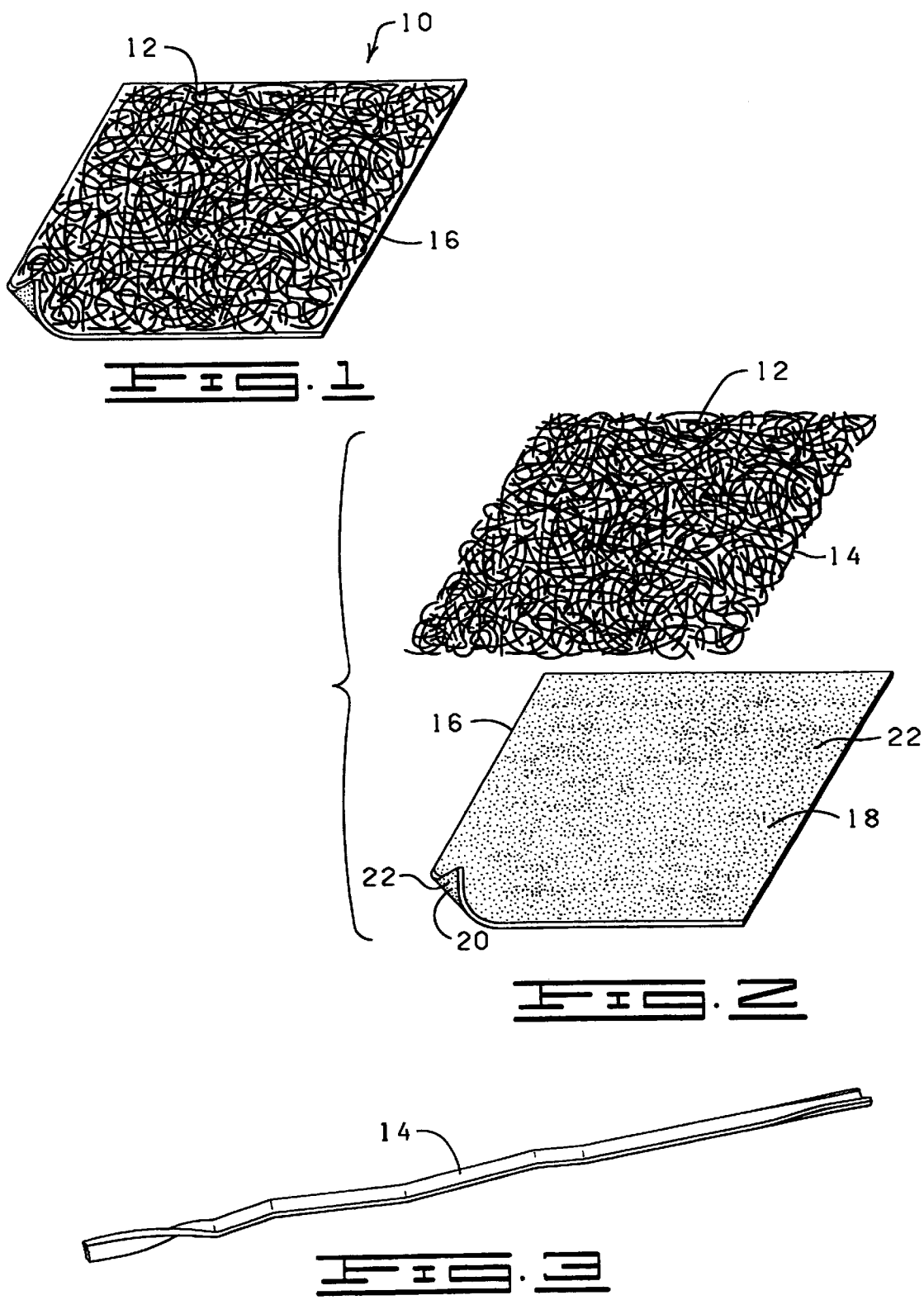

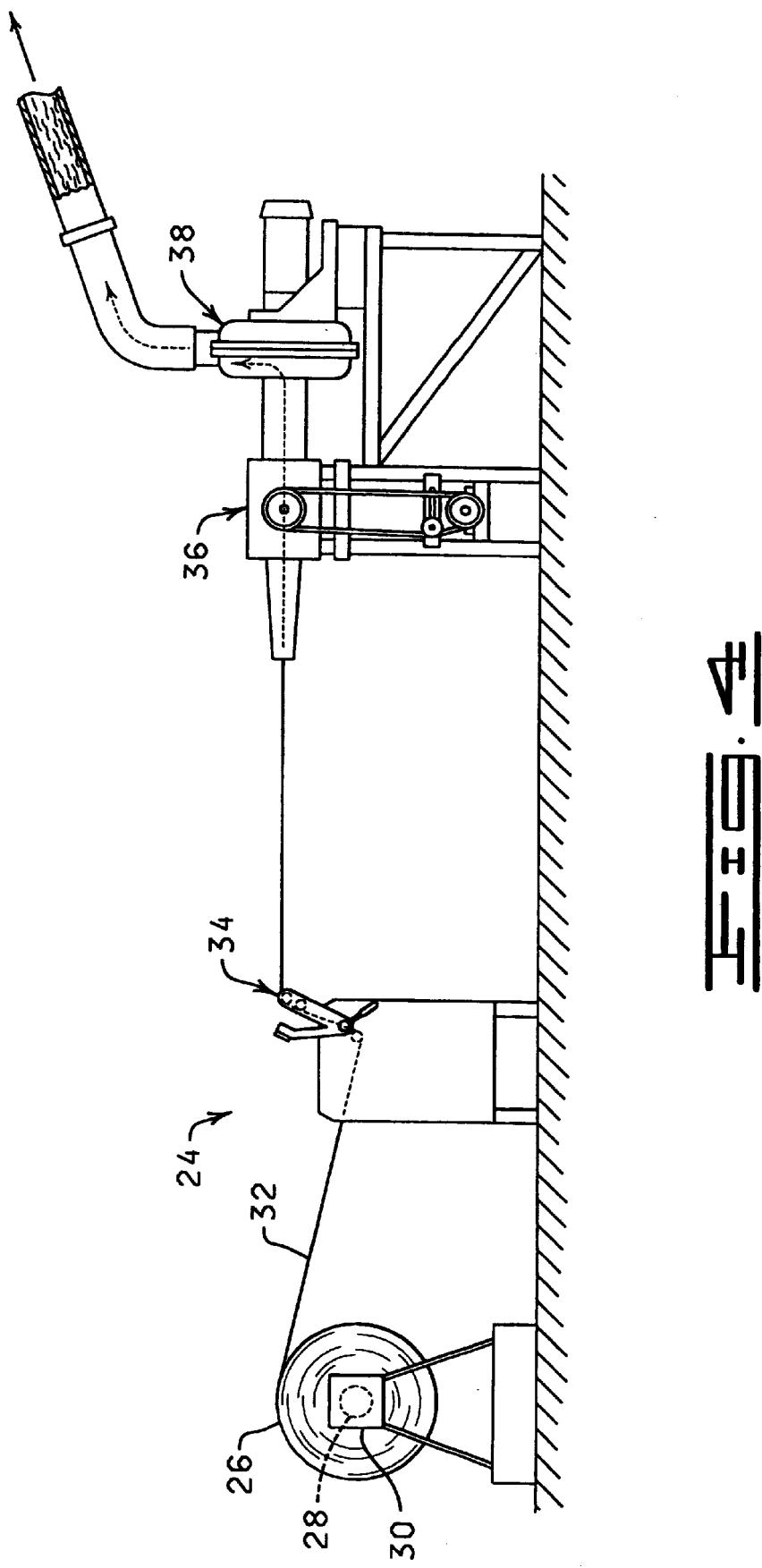

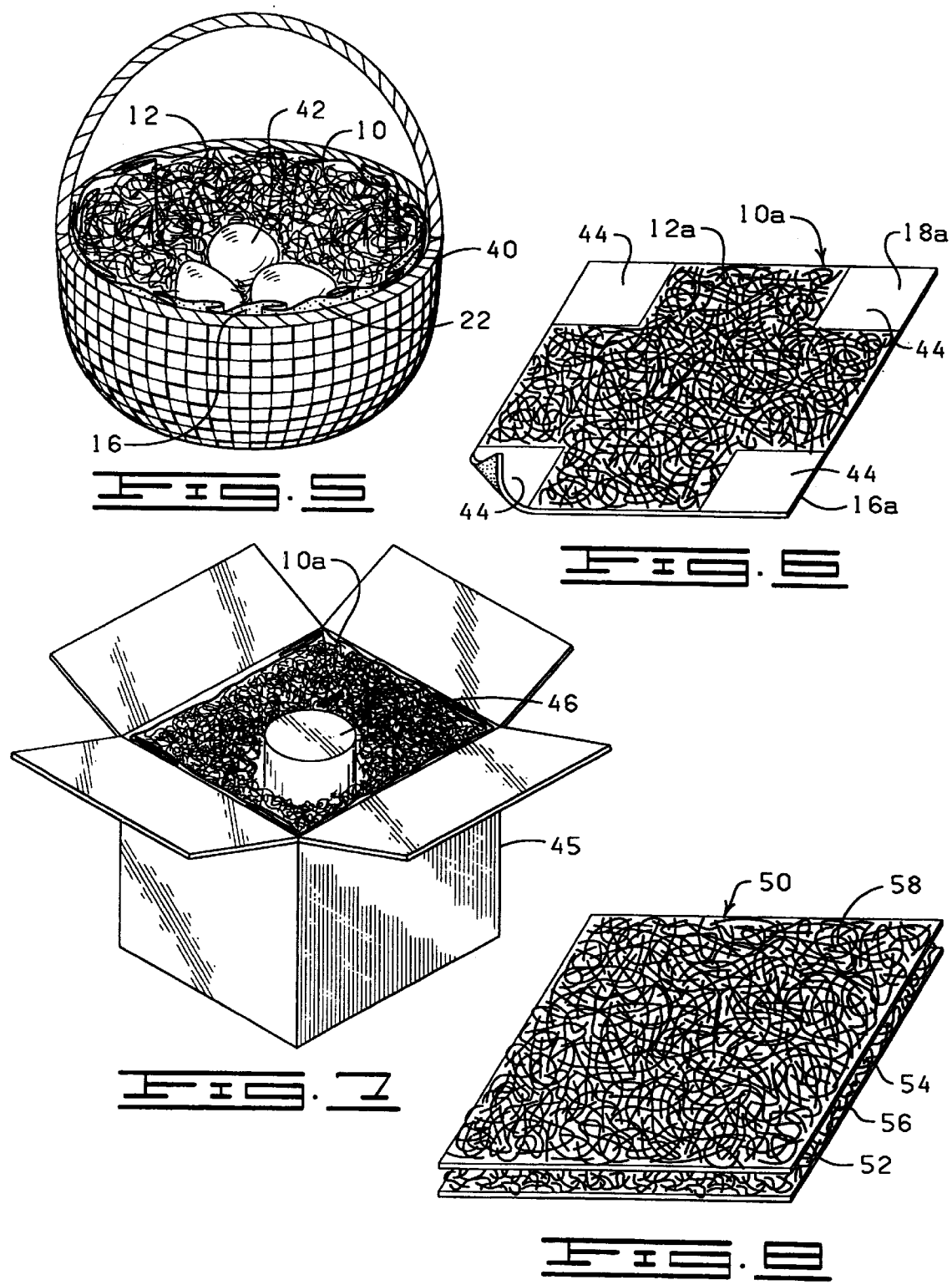

PACKAGING MATERIAL

CROSS-REFERENCE TO RELATED APPLICATIONS

This application is a continuation of U.S. Ser. No. 09/522,429, filed Mar. 9, 2000 now U.S. Pat. No. 6,202,390, which is a divisional of U.S. Ser. No. 09/293,561, filed on Apr. 15, 1999, now abandoned, which is a continuation of U.S. Ser. No. 08/934,107, filed on Sep. 19, 1997, now abandoned.

Not applicable.

STATEMENT REGARDING FEDERALLY SPONSORED RESEARCH OR DEVELOPMENT

Not applicable.

BACKGROUND OF THE INVENTION

1. Field of the Invention.

The present invention relates generally to packaging materials for packaging articles, and more particularly, but not by way of limitation, to a packaging material which includes a plurality of resilient members bondably connected to a flexible backing to form a cohesive cushioning unit.

2. Brief Description of the Related Art.

In the process of shipping an article from one location to another, the article is typically placed in a container along with a protective packaging material to fill the voids about the article and to cushion the article during the shipping process. One common protective packaging material is comprised of a plurality of plastic foam, peanut-shaped members which are commonly known as "styrofoam peanuts." An advantage in using styrofoam peanuts is the ease with which they may be disposed about an article positioned in a container by simply pouring the styrofoam peanuts from a dispenser.

However, while styrofoam peanuts have been widely accepted in the packaging industry, they are not without disadvantages. For example, the light weight and flowability of the styrofoam peanuts results in heavier objects gravitating through the peanuts to the bottom of the container where the object can be damaged. Also, while the flowability of the styrofoam peanuts facilitates the introduction of the peanuts into a container, the receiver of the package is left with having to deal with the peanuts upon removal of the article from the container in the form of having to clean up the mess left by the peanuts which are easily scattered upon removal of the article from the container.

These and other disadvantages associated with the disposal of styrofoam peanuts, has made paper protective packaging material a popular alternative. Paper is biodegradable, recyclable and renewable, making it an environmentally responsible choice. However, like styrofoam peanuts, paper packaging materials is not without disadvantages in that paper, particularly shredded paper, can be inconvenient to clean up and to dispose of due to the lack of cohesiveness of the packaging material. In addition, due to the lack of resiliency in paper products, large amounts of paper are. typically required to provide the bulk needed to adequately cushion an object.

Strips of sheet material formed into tufts have also been used for many years as a packaging material. More specifically, material known as decorative grass has been used in fruit baskets, Easter baskets, and picnic baskets and for other packaging and decorative purposes. The decorative grass of the prior art has been produced by numerous methods and from a variety of materials such as polymeric materials, paper, cellophane or the like. Typically, such materials are cut and shredded to produce segments having predetermined dimensions. As such, decorative grass, like styrofoam peanuts and paper materials described above, can be inconvenient to clean up and to dispose of.

To this end, a packaging material is needed that includes a plurality of resilient strip members intertwined with one another and bondably connected to a flexible backing so as to form a unitary cushioning unit which overcomes the above-mentioned disadvantages of prior art packaging materials. It is to such a packaging material that the present invention is directed.

BRIEF SUMMARY OF THE INVENTION

The present invention is directed to a packaging material for use in filling baskets and protecting articles during a shipping process. The packaging material includes a flexible backing having a first surface and a second surface. A mass of individual, thin, flexible strips of material intertwined with one another to form a cohesive, resilient tuft is connected to the flexible backing so as to substantially cover at least one side of the flexible backing.

In another embodiment, a second flexible backing is connected to the tuft such that the tuft is disposed between each of the flexible backings.

The packaging material formed from the tuft and the flexible backing may be incorporated into a package which additionally includes a container and an article positioned within the container. The packaging material is arranged about the article to substantially surround the article positioned within the container. The flexible backing may be caused to bond to the container.

The objects, features and advantages of the present invention will become apparent from the following detailed description when read in conjunction with the accompanying drawings and appended claims.

BRIEF DESCRIPTION OF THE SEVERAL VIEWS OF THE DRAWING

FIG. 1 is a perspective view of a packaging material constructed in accordance with the present invention.

FIG. 2 is an exploded view of the packaging material of FIG. 1.

FIG. 3 is a perspective view of a strip of material used to form the tuft of FIG. 2.

FIG. 4 is a schematic representation of a system for making the strip of material of FIG. 3.

FIG. 5 is a perspective view of a basket having a tuft of packaging material disposed therein with a plurality of objects displayed on the tuft.

FIG. 6 is a perspective view of another embodiment of a packaging material constructed in accordance with the present invention.

FIG. 7 is a perspective view of a package illustrating the packaging material of FIG. 6 cushioning an article during a shipping process.

FIG. 8 is a perspective view of another embodiment of a packaging material constructed in accordance with the present invention.

DETAILED DESCRIPTION OF THE INVENTION

Referring now to the drawings, and more specifically to FIGS. 1–3, a packaging material 10 constructed in accordance with the present invention is illustrated in FIG. 1. The packaging material 10 includes a tuft 12 comprised of a plurality of individual strips or strands of material 14 (FIG. 3) bondably connected to a flexible backing 16.

The strips of material 14 can be fabricated from any flexible sheet of material, including paper, crepe paper, polymeric film, laminated polymeric film, and waxed paper, for example. The sheet of material may have printed matter and/or embossed pattern on at least one side thereof, and the embossed pattern can be either in register or out of register with the printed pattern.

The printed pattern can be printed on the sheet of material in a conventional matter so that, when the sheet of material is slit and cut to produce the strips of material 14, at least a substantial portion of the strip of material 14 contains at least a portion of the printed pattern. Further, different colors can be employed to provide the printed pattern on the sheet of material.

The sheet of material can also be embossed so as to provide the sheet of material with an embossed pattern. Further, the sheet of material can be provided with an embossed pattern as well as a printed pattern, and the embossed pattern can be either in register or out of register with the printed material and/or printed design.

The strips of material 14, as briefly described above, are commonly referred to as "Easter grass" or "decorative grass", and as mentioned above, decorative grass has been used for many years for filling fruit baskets, Easter baskets, and picnic baskets and for other decorative and packaging purposes. The decorative grass of the prior art has been produced by numerous methods and from a variety of materials, such as those listed above. Typically, such materials are shredded and cut to produce segmented strips having predetermined dimensions. While the prior art methods for making decorative grass have been widely accepted, new techniques for facilitating the use of decorative grass as a packaging material have been sought in view of the fact that decorative grass and other loose shredded packaging material readily fall onto the floor or cling to various objects making them awkward and inconvenient to clean up.

By connecting the tuft 12 to the flexible backing 16, the clean up problems associated with loose fill materials is alleviated. Also, the flexible backing 16 can be caused to adhere or cohere to an object and/or container resulting in an enhanced packaging effect. That is, with loose packaging materials, the object being packaged has a tendency to gravitate through the packaging material to the bottom of the container thereby reducing the effectiveness of the packaging material. By using the packaging material 10 disclosed herein, the cohesiveness of the packaging material 10 surrounding the object prevents the object from gravitating through the decorative grass.

As best shown in FIG. 2, the flexible backing 16 is fabricated of a substantially square or rectangle sheet of material having a length of approximately one to four feet and a width of approximately one to four feet. However, it will be appreciated that the dimensions of the flexible backing 16 may be further varied. The flexible backing 16 can be any flexible sheet of material, such as paper, crepe paper, wax paper, polymeric film, laminated polymeric film, fabric, cellulose, and foil. The flexible backing 16 may have printed matter and/or embossed pattern on at least one side thereof, and the embossed pattern can be either in register or out of register with the printed pattern. Different colors can be employed to provide the printed pattern on the flexible backing 16.

The flexible backing 16 can also be embossed so as to provide the flexible backing 16 with an embossed pattern. Further, the flexible backing 16 can be provided with an embossed pattern as well as a printed pattern, and the embossed pattern can be either in register or out of register with the printed material and/or printed design.

The flexible backing 16 may be constructed of a single layer of material or a plurality of layers of the same or different types of materials. In addition, any thickness of the flexible backing 16 may be utilized with the present invention so long as the flexible backing 16 is substantially conformable to the contour of the interior surface of a container in a manner described below.

Although the flexible backing 16 shown in FIG. 2 is square, the flexible backing 16 may be any shape. For example, the flexible backing 16 may be square, rectangular, circular or any other geometric shape. The shape of the flexible backing 16 may even have an irregular, capricious or decorative shape.

To receive the tuft 12, the flexible backing 16 is coated with a bonding material such as an adhesive or cohesive whereby the tuft 12 is caused to bond to the flexible backing 16 as illustrated in FIG. 1. The flexible backing 16, illustrated in FIG. 2, has a first surface 18, a second surface 20, and a bonding material 22 disposed on each of the first surface 18 and the second surface 20.

Alternatively, the bonding material 22 may be applied in such a manner as to substantially coat only one of the first surface 18 or the second surface 20 of the flexible backing 16. It will be further appreciated that the bonding material 22 may be disposed on the first surface 18 and/or the second surface 20 in any of a variety of patterns such as strips, circles, dots or any other geometric or biomorphic shape, including decorative designs, so long as the bonding material 22 is positioned to function in accordance with the present invention.

The term "bonding material" as used herein can mean an adhesive, frequently a pressure sensitive adhesive, or a cohesive or any adhesive/cohesive combination, having adhesive qualities (i.e., qualities of adhesion or adhesion/cohesion, respectively) sufficient to effect the connection between portions of the tuft 12 brought into engagement with the flexible backing 16. It will be appreciated that both adhesives and cohesives suitable for the purposes described herein are well known in the art, and both are commercially available.

FIG. 4 schematically illustrates a system 24 for making strips of material 14 in accordance with the present invention. The system 24 includes a roll of material 26 supported on a shaft 28 having a brake assembly 30 operably connected thereto for controlling the rate of withdrawal of the material from the roll of material 26.

The roll of material 26 provides a web of sheet material 32 which is passed through a slitter 34. The slitter 34 includes a plurality of spaced apart, stationary knives or other conventional cutting mechanism, which slit or cut the web of sheet material 32 into strips or strands of desired width.

The slitted web of sheet material 32 is passed into a cutter 36 where the slitted web of sheet material 32 is cut into predetermined lengths so as to form the strips of material 14. From the cutter 36, the strips of material 14 are conveyed by a conveyor unit 38, which is in the form of a centrifugal blower, to a storage area (not shown) which may be in the form of a suitable bin, packaging machine, or the like.

As an alternative to forming the decorative grass from the roll of material 26, it will be appreciated that the strips of material 14 may be formed from a polymeric film discharged from a film extrusion die which is then chilled prior to the slitting process. Such a method is disclosed in U.S. Pat. No. 4,292,266, entitled "Process for Making Decorative Grass", issued to Weder et al. on Sep. 29, 1981, which is hereby expressly incorporated herein by reference.

As illustrated in FIG. 3, the strips of material 14 tend to curl and form folds during the forming process. It will be appreciated that these curls and folds contribute to the resiliency and bulkiness or fluffiness of the tuft 12 produced by amassing and intertwining a plurality of the strips of material 14. It will be further appreciated that the degree to which the strips of material 14 are curled and folded can vary dependant on several factors, such as the type of material used to form the strips of material 14.

To assemble the packaging material 10, the strips of material 14 are amassed and intertwined to form the tuft 12 and then the tuft 12 is bondably connected to the flexible backing 16.

FIG. 5 illustrates one use of the packaging material 10 described above. The packaging material 10 is shown disposed in a basket 40 and supporting a plurality of articles or objects 42, such as candies or Easter eggs, for display. More specifically, the packaging material 10 is positioned in the interior of the basket 40 such that the flexible backing 16 substantially conforms to the contour of the interior surface of the basket 40 thereby lining the interior surface of the basket 40 with the articles being supported by the tuft 12. If the second surface 20 of the flexible backing 16 is provided with the bonding material 22 (as shown in FIG. 5), the second surface 20 of the flexible backing 16 can be bondably connected to the interior surface of the basket 40. In addition, the bonding material 22 on the second surface 20 of the flexible backing 16 will cause overlapping portions of the flexible backing 16 to be bondably connected so as to retain the shape of the flexible backing 16 after the flexible backing 16 has been shaped to conform to the contour of the interior surface of the basket 40. If the second surface 20 of the flexible backing 16 is not provided with the bonding material 22, the flexible backing 16 is simply shaped to conform to the contour of the interior surface of the basket 40.

FIG. 6 illustrates a modified packaging material 10a which is identical in construction to the packaging material 10 illustrated in FIG. 1 with the exception that the tuft 12a is connected to a selected portion of the flexible backing 16a. In particular, the tuft 12a is connected to the first surface 18a of the flexible backing 16a so as to maintain a plurality of areas 44 extending inward from the peripheral edge of the flexible backing 16a exposed or uncovered. It will be appreciated that such a configuration will facilitate folding of the flexible backing 16a at the uncovered areas 44 when shaping the packaging material 10a to conform to the contour of a container. For example, FIG. 7 illustrates the packaging material 10a disposed in a container 45 so as to line the interior surface of the container 45. The packaging material 10a is being used as a packaging material for protecting an article 46 disposed in the container 45. In this manner, the tuft 12a of the packaging material 10a functions to cushion the article 46 during transport. protecting an article 46 disposed in the container 45. In this manner, the tuft 12a of the packaging material 10a functions to cushion the article 46 during transport.

FIG. 8 illustrates another embodiment of a packaging material 50 constructed in accordance with the present invention. The packaging material 50 includes a pair of flexible backings 52 and 54 alternated with a pair of tufts 56 and 58 of individual, thin, flexible strips of material. The tuft 56 substantially covers and is connected to the first surface of the flexible backing 52 in the manner described above in reference to FIGS. 1–3. The flexible backing 54 in turn is connected to the tuft 56 such that the tuft 56 is interposed between the flexible backing 52 and the flexible backing 54. The tuft 58 is connected to the flexible backing 54 on the surface opposite to which the tuft 56 is connected whereby the flexible backings 52 and 54 are alternated with the tufts 56 and 58. Like the packaging material 10, a bonding material may be applied to the flexible backing 52 so that the flexible backing 52 may be bondably connected to the interior surface of a container in a manner as described above.

From the above description it is clear that the present invention is well adapted to carry out the objects and to attain the advantages mentioned herein as well as those inherent in the invention. While presently preferred embodiments of the invention have been described for purposes of this disclosure, it will be understood that numerous changes may be made which will readily suggest themselves to those skilled in the art and which are accomplished within the spirit of the invention disclosed and as defined in the appended claims.

What is claimed is:

1. A method of packaging an object in a container, comprising:
    providing a packaging material comprising:
        a flexible backing having a first surface and a second surface, the second surface opposite the first surface; and
        a mass of individual, thin, flexible strips of material intertwined with one another to form a resilient tuft, the mass of individual, thin, flexible strips of material substantially covering and connected to the first surface of the flexible backing;
    positioning the packaging material into the container such that the flexible backing substantially conforms to the contour of an interior surface of the container thereby lining the interior surface of the container with the flexible backing and such that the mass of individual, thin, flexible strips of material is exposed to receive at least one object thereon; and
    positioning the object on the tuft such that the object is substantially surrounded by the tuft to prevent its lateral movement and cushioningly support the object during transport of the container.

2. The method of claim 1 further comprising: connecting the second surface of the flexible backing to the
    interior surface of the container.

3. The method of claim 1 wherein the strips of material are Easter grass.

4. The method of claim 3 further comprising:
    connecting the second surface of the flexible backing to the interior surface of the container.

5. A method of packaging an object in a container, comprising:
    providing a packaging material comprising:
        a first flexible backing having a first surface and a second surface, the second surface opposite the first surface,
        a first mass of individual, thin, flexible strips of material intertwined with one another to form a cohesive, resilient tuft, the mass substantially covering and connected to the first surface of the flexible backing;

a second flexible backing having a first surface and a second surface, the second surface opposite the first surface, the second surface of the second flexible backing connected to the first mass such that the first mass is interposed between the first flexible backing and the second flexible backing; and a second mass of individual, thin, flexible strips of material intertwined with one another to form a cohesive, resilient tuft, the second mass of individual, thin, flexible strips of material substantially covering and connected to the first surface of the flexible backing such that the second mass of individual, thin, flexible strips of material is exposed to receive and support at least one object thereon;

positioning the packaging material into the container such that at least the first flexible backing substantially conforms to the contour of an interior surface of the container thereby lining the interior surface of the container with the first flexible backing and such that the second mass of individual, thin, flexible strips of material is exposed to receive at least one object thereon; and positioning the object on the second mass such that the object is substantially surrounded by the tuft to prevent its lateral movement and cushioningly support the object during transport of the container.

6. The method of claim 5 further comprising:

connecting the second surface of the first flexible backing to the interior surface of the container.

7. The method of claim 5 wherein the strips of material of the first and second mass are Easter grass.

8. The method of claim 7 further comprising:

connecting second surface of the first flexible backing to the interior surface of the container.

* * * * *